(12) United States Patent
Shvartsman et al.

(10) Patent No.: US 9,599,687 B2
(45) Date of Patent: Mar. 21, 2017

(54) ACTIVE RESISTIVE SHIMMING FOR MRI DEVICES

(71) Applicant: ViewRay Incorporated, Oakwood Village, OH (US)

(72) Inventors: Shmaryu M. Shvartsman, Highland Heights, OH (US); James F. Dempsey, Chagrin Falls, OH (US)

(73) Assignee: ViewRay Technologies, Inc., Oakwood Village, OH (US)

( * ) Notice: Subject to any disclaimer, the term of this patent is extended or adjusted under 35 U.S.C. 154(b) by 0 days.

(21) Appl. No.: 14/658,079

(22) Filed: Mar. 13, 2015

(65) Prior Publication Data

US 2015/0185300 A1 Jul. 2, 2015

Related U.S. Application Data

(63) Continuation of application No. 13/324,850, filed on Dec. 13, 2011, now Pat. No. 8,981,779.

(51) Int. Cl.
*G01V 3/00* (2006.01)
*G01R 33/36* (2006.01)
(Continued)

(52) U.S. Cl.
CPC ..... *G01R 33/3642* (2013.01); *G01R 33/3875* (2013.01); *G01R 33/3806* (2013.01); *G01R 33/4808* (2013.01)

(58) Field of Classification Search
CPC .................................................. G01R 33/3875
(Continued)

(56) References Cited

U.S. PATENT DOCUMENTS 3,569,823 A 3/1971 Golay
3,735,306 A * 5/1973 Kabler et al. ................. 336/192
(Continued)

FOREIGN PATENT DOCUMENTS

CN 101452065 A 6/2009
EP 0152554 A2 8/1985
(Continued)

OTHER PUBLICATIONS

Green et al. "Split cylindrical gradient coil for combined PET-MR system." Proc. Intl. Soc. Mag. Reson. Med. 16 (2008):352.
(Continued)

*Primary Examiner* — Louis Arana
(74) *Attorney, Agent, or Firm* — Mintz Levin Cohn Ferris Glovsky and Popeo, P.C.

(57) ABSTRACT

Active resistive shim coil assemblies may be used in magnetic resonance imaging (MRI) systems to reduce in-homogeneity of the magnetic field in the imaging volume. Disclosed embodiments may be used with continuous systems, gapped cylindrical systems, or vertically gapped systems. Disclosed embodiments may also be used with an open MRI system and can be used with an instrument placed in the gap of the MRI system. An exemplary embodiment of the active resistive shim coil assembly of the present disclosure includes active resistive shim coils each operable to be energized by separate currents through a plurality of power channels. In some embodiments, the disclosed active resistive shim coil assemblies allow for various degrees of freedom to shim out field in-homogeneity.

21 Claims, 9 Drawing Sheets

(51) Int. Cl.
  *G01R 33/3875* (2006.01)
  *G01R 33/48* (2006.01)
  *G01R 33/38* (2006.01)
(58) Field of Classification Search
  USPC .......................................... 324/320, 319, 318
  See application file for complete search history.

(56) References Cited

U.S. PATENT DOCUMENTS

| | | | |
|---|---|---|---|
| 4,642,569 A * | 2/1987 | Hayes | G01R 33/42 |
| | | | 324/300 |
| 4,652,826 A * | 3/1987 | Yamamoto | G01R 33/24 |
| | | | 324/318 |
| 4,740,753 A * | 4/1988 | Glover et al. | 324/320 |
| 5,006,804 A | 4/1991 | Dorri et al. | |
| 5,365,927 A | 11/1994 | Roemer et al. | |
| 5,378,989 A | 1/1995 | Barber et al. | |
| 5,530,352 A | 6/1996 | Kolem | |
| 5,585,724 A | 12/1996 | Morich et al. | |
| 5,592,091 A * | 1/1997 | Manabe | 324/320 |
| 5,760,582 A * | 6/1998 | Morrone | 324/318 |
| 5,952,830 A | 9/1999 | Petropoulos et al. | |
| 6,311,389 B1 | 11/2001 | Uosaki et al. | |
| 6,509,735 B2 * | 1/2003 | Mueller | G01R 33/3875 |
| | | | 324/307 |
| 6,591,127 B1 | 7/2003 | McKinnon | |
| 6,788,060 B1 | 9/2004 | Feenan et al. | |
| 6,940,281 B2 | 9/2005 | Feenan et al. | |
| 7,489,131 B2 | 2/2009 | Lvovsky | |
| 8,334,697 B2 * | 12/2012 | Overweg | A61B 5/055 |
| | | | 324/318 |
| 8,378,677 B2 | 2/2013 | Morich et al. | |
| 8,896,308 B2 | 11/2014 | Shvartsman et al. | |
| 8,981,779 B2 * | 3/2015 | Shvartsman et al. | 324/320 |
| 2003/0197507 A1 | 10/2003 | Liu | |
| 2004/0239327 A1 | 12/2004 | Heid et al. | |
| 2005/0030028 A1 | 2/2005 | Clarke et al. | |
| 2005/0197564 A1 | 9/2005 | Dempsey | |
| 2006/0033496 A1 | 2/2006 | Shvartsman et al. | |
| 2008/0116894 A1 | 5/2008 | Weiger et al. | |
| 2010/0322497 A1 | 12/2010 | Dempsey et al. | |
| 2011/0012593 A1 | 1/2011 | Shvartsman et al. | |
| 2012/0150017 A1 | 6/2012 | Yamaya et al. | |
| 2013/0245425 A1 | 9/2013 | Dempsey | |
| 2013/0296687 A1 | 11/2013 | Dempsey | |
| 2014/0121495 A1 | 5/2014 | Dempsey | |
| 2014/0263990 A1 | 9/2014 | Kawrykow et al. | |
| 2014/0266206 A1 | 9/2014 | Dempsey et al. | |
| 2014/0266208 A1 | 9/2014 | Dempsey et al. | |
| 2014/0275963 A1 | 9/2014 | Shvartsman et al. | |
| 2014/0330108 A1 | 11/2014 | Dempsey | |
| 2014/0347053 A1 | 11/2014 | Dempsey et al. | |
| 2015/0065860 A1 | 3/2015 | Shvartsman et al. | |
| 2015/0077118 A1 | 3/2015 | Shvartsman et al. | |
| 2015/0154756 A1 | 6/2015 | Gerganov et al. | |
| 2015/0165233 A1 | 6/2015 | Dempsey et al. | |

FOREIGN PATENT DOCUMENTS

| | | |
|---|---|---|
| EP | 2230530 A1 | 9/2010 |
| JP | H03243877 A | 10/1991 |
| JP | H07148142 A | 6/1995 |
| JP | H07-213507 A | 8/1995 |
| JP | 2004351207 A | 12/2004 |
| JP | 2008532681 A | 8/2008 |
| JP | 2009-112870 A | 5/2009 |
| WO | WO-03/008986 A2 | 1/2003 |
| WO | WO-2006/097864 A1 | 9/2006 |
| WO | WO-2008/122899 A1 | 10/2008 |
| WO | WO-2009/004521 | 1/2009 |
| WO | WO-2009/107005 A2 | 9/2009 |
| WO | WO-2010/103644 A1 | 9/2010 |
| WO | WO-2011/008969 A1 | 1/2011 |

OTHER PUBLICATIONS

Lucas et al. "Simultaneous PET-MR: toward a combined microPET®-MR system." *Proc. Intl. Soc. Mag. Reson. Med.* 15(2007):922.

Overweg et al. "System for MRI guided Radiotherapy." *Proc. Intl. Soc. Mag. Reson. Med.* 17(2009):594.

Shvartsman et al. "Gradient Coil Induced Eddy Current Computation Using the Boundary Elements Method." *Proc. Intl. Soc. Mag. Reson. Med.* 17(2009):3055.

Lagendijk J. J. et al. "MRI guided radiotherapy: A MRI based linear accelerator." Radiotherapy & Oncology. vol. 56, No. Supplement 1. Sep. 2000. (Sep. 2000):S60-S61. XP008012866. 19th Annual Meeting of the European Society for Therapeutic Radiology and Oncology. Istanbul, Turkey; Sep. 19-23, 2000.

* cited by examiner

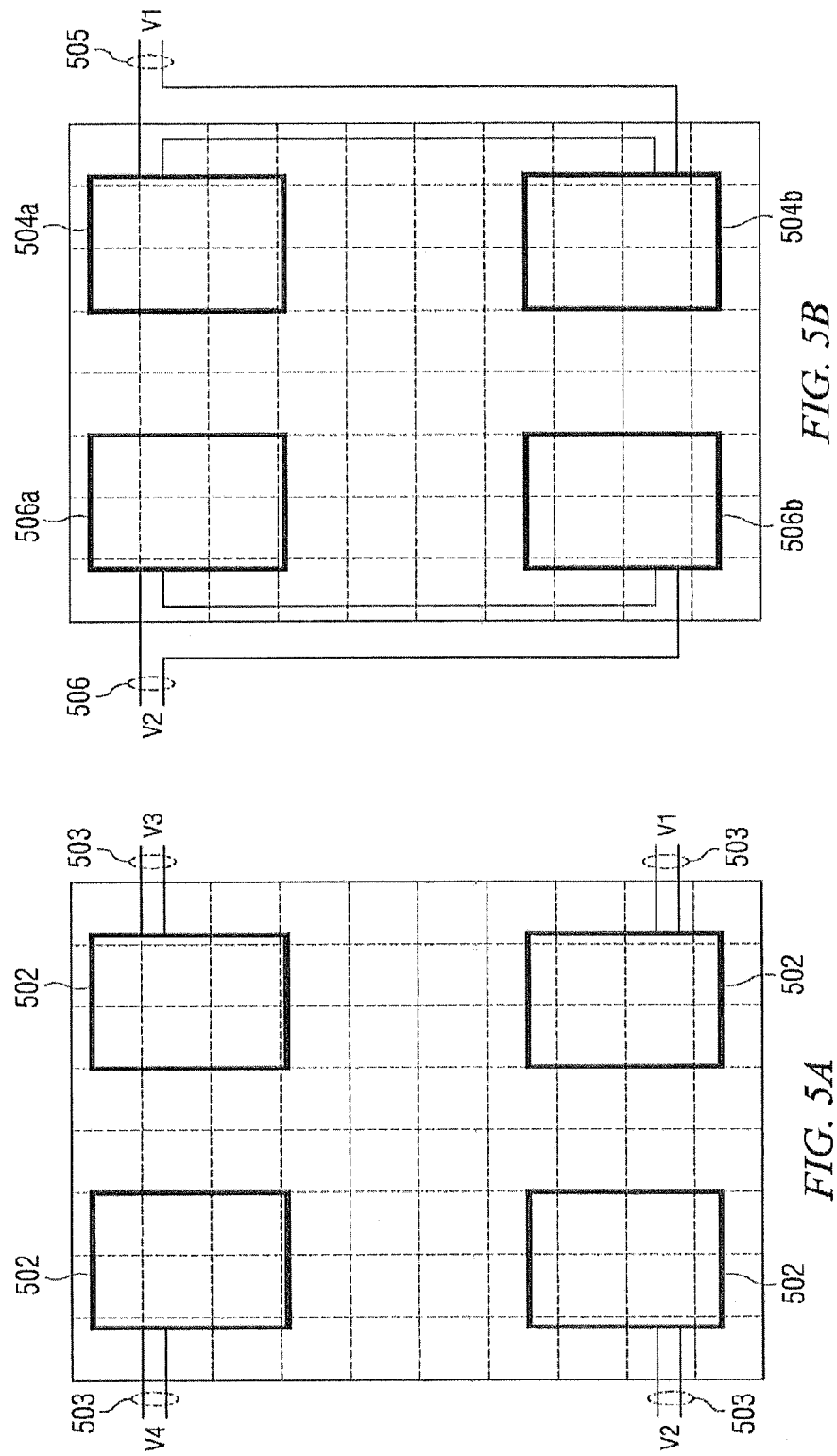

ACTIVE RESISTIVE SHIMMING FOR MRI DEVICES

BACKGROUND

1. Technical Field

The present application relates to systems and methods for magnetic resonance imaging ("MRI") and particularly to active shimming for MRI systems. This application is a continuation of Ser. No. 13/324,850, entitled "Active Resistive Shimming for MRI Devices," filed Dec. 13, 2011, and issued on Mar. 17, 2015 as U.S. Pat. No. 8,981,779, the disclosure of which is incorporated by reference herein in its entirety.

2. Related Art

Magnetic resonance imaging, or nuclear magnetic resonance imaging, is primarily a medical imaging technique used most commonly in radiology to visualize the internal structure and function of the body, MRI methods and techniques are described, for example, by E. MARK HAACKE ET AL., MAGNETIC RESONANCE IMAGING: PHYSICAL PRINCIPLES AND SEQUENCE DESIGN (Wiley-Liss 1999), which is hereby incorporated by reference. The present disclosure relates to the magnetic resonance arts. It finds particular application in conjunction with medical magnetic resonance imaging and will be described with particular reference thereto. It is to be appreciated, however, that the disclosure also finds application in conjunction with other types of magnetic resonance imaging systems, magnetic resonance spectroscopy systems, and the like.

SUMMARY

An exemplary embodiment of a magnetic resonance imaging (MRI) system comprises a first magnet, a first gradient coil disposed between the first magnet and a longitudinal axis of the MRI system, and an active resistive shim coil assembly disposed outside of the first magnet and proximate to the first gradient coil. The active resistive shim coil assembly comprises a plurality of shim coils, and the plurality of shim coils are each connected to a plurality of power channels and operable to be energized by separate currents through the plurality of power channels.

An exemplary embodiment of an active resistive shim coil assembly comprises an active X-shim coil comprising four quadrants, in which a first pair of the four quadrants of the X-shim coil are disposed symmetrically about a central plane, and a second pair of the four quadrants of the X-shim coil are disposed symmetrically about the central plane. The active resistive shim coil assembly may further comprise an active Y-shim coil comprising four quadrants, in which a first pair of the four quadrants of the Y-shim coil are disposed symmetrically about the central plane and a second pair of the four quadrants of the Y-shim coil are disposed symmetrically about the central plane. The active resistive shim coil assembly may further comprise an active Z-shim coil comprising a pair of halves disposed symmetrically about the central plane. In an embodiment, the active X-shim, active Y-shim, and active Z-shim coils are each operable to be energized by separate currents through a plurality of power channels, and the active shim coil assembly does not include a second order or higher order shim coil.

Another exemplary embodiment of a magnetic resonance imaging (MRI) system comprises a magnet, a gradient coil disposed between the magnet and a longitudinal axis of the MRI system, and an active resistive shim coil assembly disposed outside of the magnet and proximate to the gradient coil. The active shim coil assembly comprises a plurality of shim coils, and the plurality of shim coils comprise: 1) an active X-shim coil comprising four quadrants, wherein a first pair of the four quadrants of the X-shim coil are disposed symmetrically about a central plane of the MRI system and a second pair of the four quadrants of the X-shim coil are disposed symmetrically about the central plane; 2) an active Y-shim coil comprising four quadrants, wherein a first pair of the four quadrants of the Y-shim coil are disposed symmetrically about the central plane and a second pair of the four quadrants of the Y-shim coil are disposed symmetrically about the central plane; and 3) an active Z-shim coil comprising a pair of halves disposed symmetrically about the central plane. The active X-shim, active Y-shim, and active Z-shim coils are each operable to be energized by separate currents through a plurality of power channels, and the active resistive shim coil assembly does not include a second order or higher order shim coil.

Further disclosed is an exemplary embodiment of a method of shimming a field in-homogeneity in a magnetic resonance imaging (MRI) system comprising a magnet, a gradient coil, and an active resistive shim coil assembly disposed outside of the magnet and proximate to the gradient coil, the active resistive shim coil assembly comprising shim coils operable to be energized by currents provided through a plurality of power channels. The disclosed exemplary method comprises maintaining a magnetic field, determining the field in-homogeneity in an imaging volume, determining currents to be provided to the shim coils of the active resistive shim coil assembly, applying the currents to the shim coils, wherein the shim coils energized by the currents are operable to shim out at least some of the field inhomogeneity, and repeating maintaining the magnetic field and determining the field inhomogeneity at least once after determining the currents and applying the currents.

BRIEF DESCRIPTION OF THE DRAWINGS

Features, aspects, and embodiments of the disclosure are described in conjunction with the attached drawings, in which:

FIG. 5A shows a first power connection scheme for a plurality of quadrants of the X-shim or Y-shim coils;

FIG. 5B shows a second power connection scheme for a plurality of quadrants of the X-shim or Y-shim coils;

DETAILED DESCRIPTION

Figure 1:
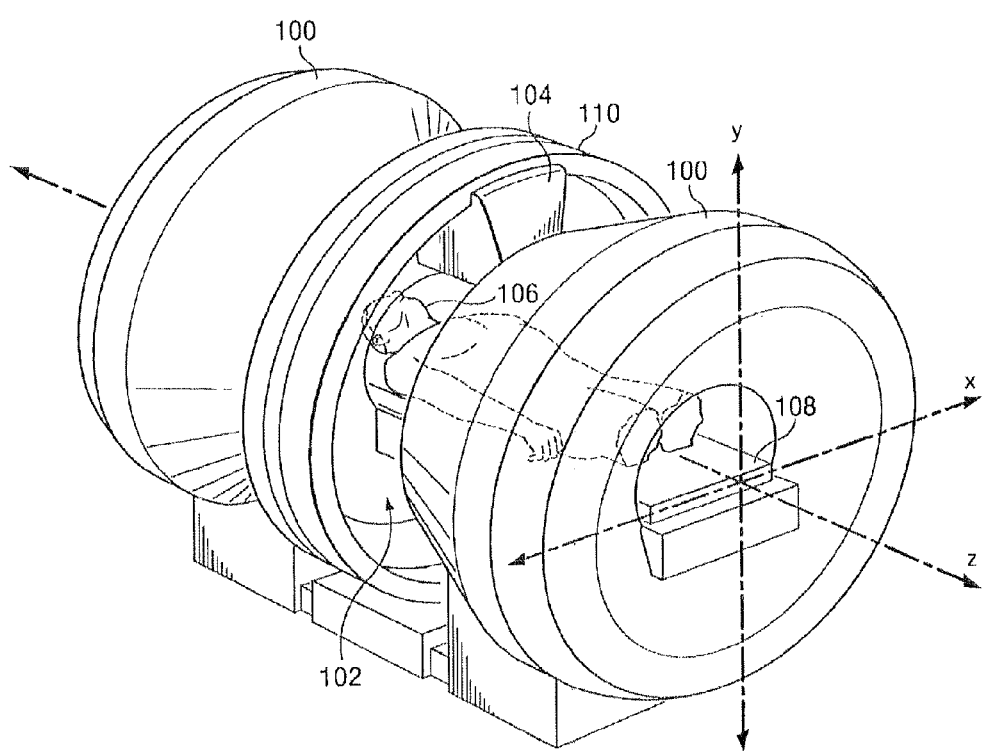
FIG. 1 shows a perspective view of a horizontal open MRI system with an instrument located in its center gap region, as can be used with some embodiments of the present disclosure.

In magnetic resonance imaging, linear magnetic field gradients are used for spatial encoding. Gradient coils are used to produce these linear magnetic field gradients. Horizontal cylindrical MRI systems have horizontal cylindrical gradient coil assemblies that span the length of the device. Open horizontal MRI systems have a split main magnet with a gap in the center and may have split gradient coils as well. More recently, it has become desirable to include various treatment and imaging modalities in combination with MRI systems and open MRI systems, such as radiation therapy devices, biopsy needles, ablation devices, surgical devices, ultrasound, PET, SPECT, CT, LINAC, and others. For example, it would be desirable to place such instruments in the gap region of an open MRI system.

The quality of MRI images can be negatively affected by the field in-homogeneity of the main magnet field inside the imaging volume. In some MRI systems, such as continuous cylindrical or vertically gapped systems, superconductive shim coils are positioned inside the main magnet and are used to decrease the field in-homogeneity due to imperfection of the magnet. For a continuous cylindrical magnet (un-gapped magnet), the superconductive shims may include first order shim coils, such as X-shim, Y-shim and Z-shim coils and higher order shim coils that continuously span through the central axial plane of the MRI system. These shim coils are energized one at a time during an active superconductive-shimming procedure.

Passive shimming techniques may also be used to shim-out, to some extent, the residual in-homogeneity after the superconductive shims have been applied. The passive shims, which usually comprise pieces of ferromagnetic metal, are placed either inside the gradient coil or on the inner bore surface of the main magnet. Several iterations of combining active superconductive shimming and passive shimming may be required to achieve the desired level of in-homogeneity.

However, once the superconductive shim coils are energized by currents, the power channel will be closed because location of the superconductive shim coils inside the main magnet prevents further access to the shim coils. As such, continuing variation of each shim coil is not possible. If it is desired to adjust the currents to the superconductive shim coils, the access to the shim switches in the main magnet would have to be opened to gain access to the superconductive shim coils.

Active resistive shim coils may be used for shimming out the patient induced inhomogeneity. These shim coils may include zero-order, first-order, and second-order shim coils such as Z0, Z2, XZ, YZ, XY, and X2-Y2 types, or even higher order. These shim coils may be Golay type coils described in the patent by Golay in U.S. Pat. No. 3,569,823, which is hereby incorporated by reference, or may be distributed ones. One disadvantage associated with the configuration of the active shim coils in the above discussed systems is that all portions of each shim coil are connected in series and controlled by the same power channel. The series connection of the portions of the shim coil limits the degrees of freedom to shim out in-homogeneity.

The active resistive shim coil assemblies of the present disclosure may be used with any type of MRI system. One aspect of the active resistive shim coil assembly of the present disclosure that may be different from conventional active shim coils is that each shim coil of the present active resistive shim coil assembly may be connected to and controlled by a plurality of power channels. Such a configuration allows for various additional degrees of freedom in energizing the active resistive shim coils and the generation of harmonics that can more effectively shim out in-homogeneity.

Unlike conventional active shim coils, another aspect of the active resistive shim coil assembly of the present disclosure may include configuration for accommodating a split solenoid horizontal "open" MRI system that includes a gap between two horizontal MRI magnet halves. In conventional horizontal systems, there are typically five types of shim coils: Z0, Z2, XZ, YZ, XY, and X2-Y2. In this case, the XZ and YZ shim coils are disposed symmetrically about and extend across the central plane, which is impossible for a split system. In an exemplary embodiment, to accommodate the gap in an open MRI system, the active shim coil assembly of the present disclosure may have split X-type, Y-type, and Z-type active shim coils only instead of second order or higher order shim coils. Providing the corresponding currents to the X-type, Y-type, and Z-type active shim coils through a plurality of power channels, one can generate the harmonics of all Z0, Z2, XZ, YZ, XY, X2-Y2 shim coils as well as higher order shims.

The shim coil assemblies disclosed herein are further well suited for use with a horizontal open MRI system that is used with an additional medical instrument being operated within its gap. FIG. 1 depicts such an arrangement with a horizontal open MRI system 100 having a gap region 102. An instrument 104 is mounted in the gap region 102 on a gantry 110. Also depicted are a patient 106 and patient couch 108. In some embodiments, the gantry 110 can be used to reposition the instrument 104 about the patient 106 (i.e., about the Z-axis shown in FIG. 1).

The embodiment of FIG. 1 can include elements of a system of the assignee of the current application, ViewRay Incorporated, described, in part, in U.S. Patent Application Publication 2005/0197564 to Dempsey, titled "System for Delivering Conformal Radiation Therapy while Simultaneously Imaging Soft Tissue" (hereafter "Dempsey '564"), which is hereby incorporated by reference. For example, the instrument 104 can comprise a radiation therapy device and associated multi-leaf collimator (MLC), which, in combination with a fast-imaging horizontal open MRI system, allows for improved radiation therapy that accounts for target location during treatment, as discussed in Dempsey '564. While only a single assembly is shown as the instrument 104 in FIG. 1, some embodiments can include multiple assemblies associated with instrument 104. For example, some embodiments may include three radiation head assemblies (not shown in FIG. 1) mounted in gap 102, distributed about the Z-axis, and rotatable about the Z-axis on the gantry 110. While some aspects of the embodiments disclosed herein are described with respect to the ViewRay system disclosed by Dempsey '564, such aspects are not required for use with the disclosed shim coil assembly. It is contemplated that the shim coil assembly disclosed herein may be used in any type of MRI system, with or without the use of an associated instrument 104. Furthermore, for systems utilizing an instrument 104, such instruments are not limited to radiation therapy devices such as radiation sources, or a LINAC, but can include any type of instrument used with an MRI system.

Figure 2A:
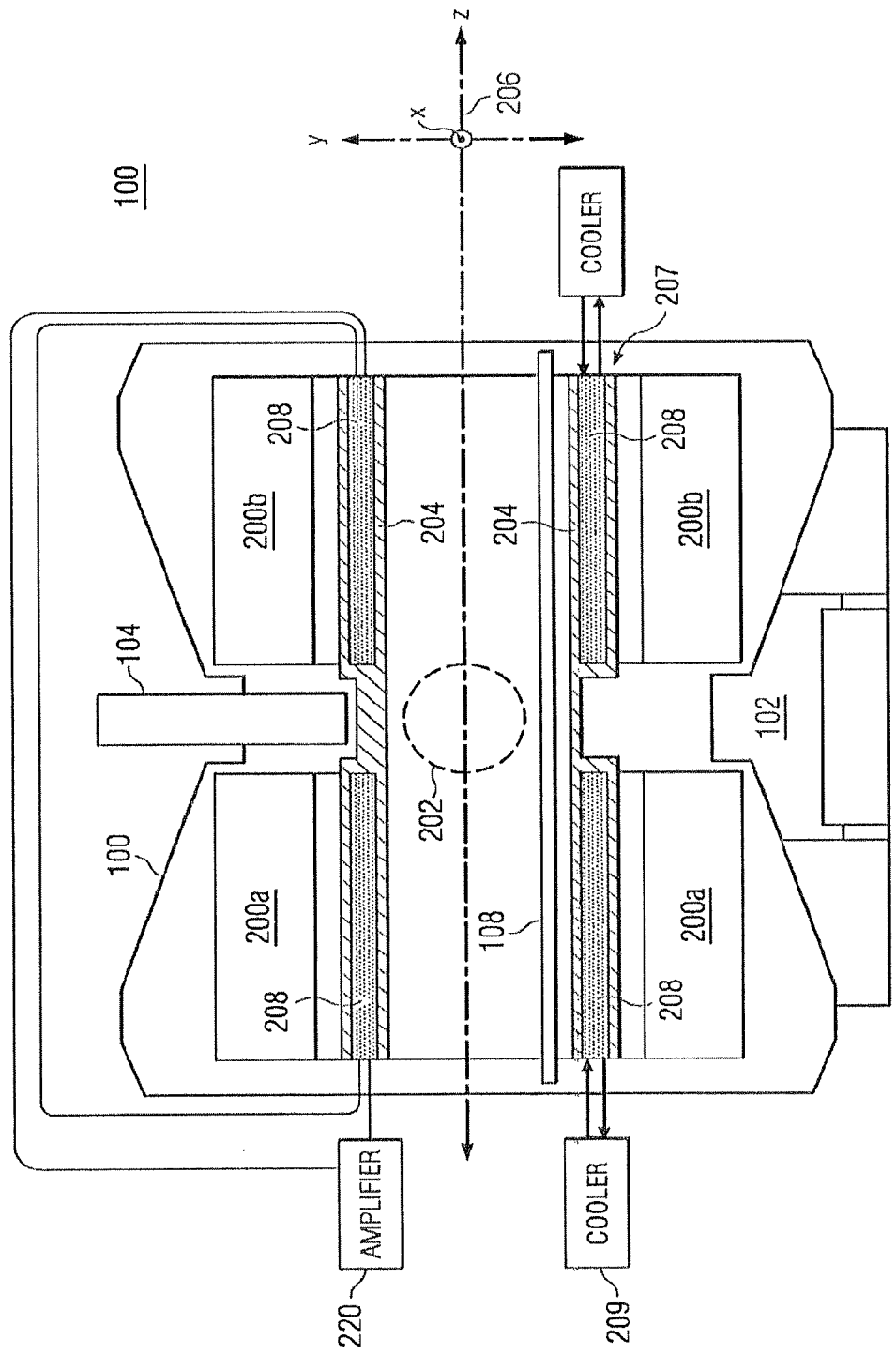
FIG. 2A shows a simplified cross-sectional view of the embodiment of the system shown in FIG. 1.

FIG. 2a is diagrammatic cross-section of the system shown in FIG. 1. The embodiment of FIG. 2a depicts a horizontal open MRI system 100 including a pair of main magnets 200, separated by gap 102. It is to be appreciated that the MRI system 100 may be designed to include only one main magnet 200 in accordance with the principles of the present disclosure for embodiments related to un-gapped MRI system. The MRI system is used to image a region of interest 202 above patient couch 108. The MRI system 100 includes additional conventional components not shown, for example, a radio frequency (RF) system including RF coils. The coordinate system used in the figures and throughout this disclosure refers to the longitudinal axis through the MRI bore as the Z-axis. The X-axis extends perpendicular to the Z-axis and from side to side of the MRI system 100; the Y-axis extends perpendicular to the Z-axis and from the bottom to the top of MRI system 100.

Also depicted in FIG. 2a is a first gradient coil 204 disposed between the magnets 200 and the longitudinal axis 206 through the MRI bore (the Z-axis). The MRI system 100 includes an active resistive shim coil assembly 208 disposed outside of the magnets 200 and proximate to the first gradient coil 204. The active shim coil assembly 208 may include a plurality of shim coils each connected to a plurality of power channels (not shown) in at least one amplifier 220. The plurality of shim coils may each be operable to be energized by a separate current provided through the plurality of power channels in the at least one amplifier 220.

In an embodiment, the first gradient coil 204 may be disposed in a gradient coil assembly 207 comprising other gradient coils and/or shield coils as described in U.S. patent application Ser. No. 12/951,976, which is commonly-owned and hereby incorporated by reference.

Figure 2B:
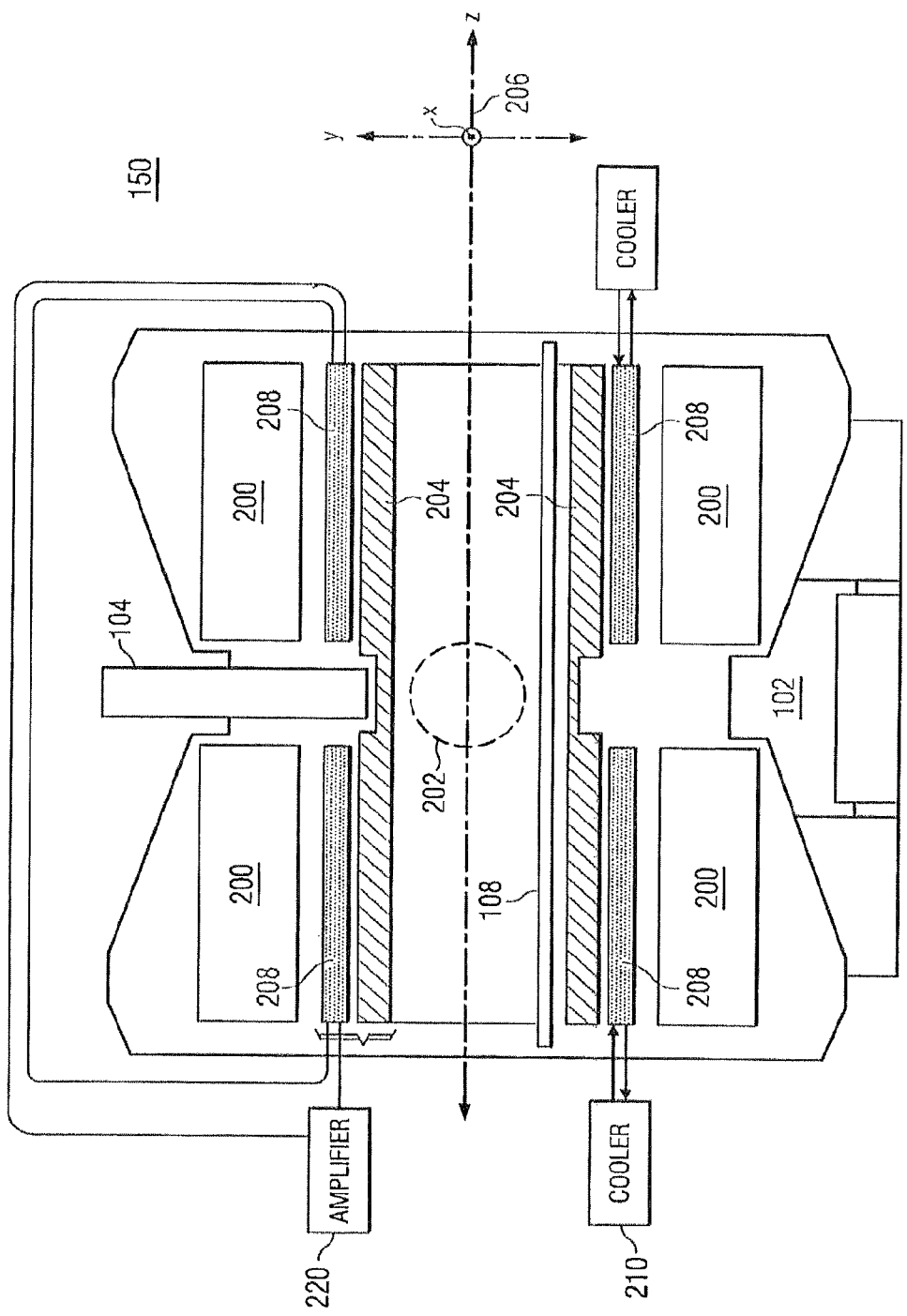
FIG. 2B shows a simplified cross-sectional view of an embodiment of a MRI system in accordance with the present disclosure.

It is to be appreciated that the location of the active resistive shim coil assembly 208 outside of the magnets 200 may vary. The active resistive shim coil assembly 208 may be disposed on either side of the first gradient coil 204 in the radial direction. In an embodiment, the active resistive shim coil assembly 208 may be disposed between the magnets 200 and the first gradient coil 204. In another embodiment, the active resistive shim coil assembly 208 may be disposed between the first gradient coil 204 and the longitudinal axis 206. The active resistive shim coil assembly 208 may be disposed inside or outside of the gradient coil assembly 207. In the exemplary embodiment illustrated in FIG. 2a, the active resistive shim coil assembly 208 is disposed within the gradient coil assembly 207. A cooling unit 209 of the MRI system 100 may provide cooling for both the active resistive shim coil assembly 208 and the gradient coil 204. Shown in FIG. 2b is a MRI system 150 that is substantially similar to the MRI system 100 except the location of the active resistive shim coil assembly 208. In the MRI system 150, the active resistive shim coil assembly 208 is disposed outside of the gradient coil assembly 207. The active resistive shim coil assembly 208 is disposed between the magnets 200 and the gradient coil assembly 207. In this embodiment, a dedicated cooling unit 210 may be included in the MRI system 150 for cooling for the active resistive shim coil assembly 208.

It is to be appreciated that the beneficial effects of supplying currents through multiple power channels to each shim coil of the active resistive shim coil assembly 208 may be optimized by disposing the active resistive shim coil assembly 208 outside of the magnets 200. Such a location of the active resistive shim coil assembly does not require the power channels to be closed after the shim coils of the active resistive shim coil assembly 208 are energized. As such, easy and continuing variation of the currents to each active shim coil may be realized.

In an embodiment, the active resistive shim coil assembly 208 of the present disclosure may include various combinations of active resistive shim coils, such as an active X-shim type coil (hereafter "X-shim coil"), an active Y-shim type coil (hereinafter "Y-shim coil"), and an active Z-shim type coil (hereinafter "Z-shim coil"). In an exemplary embodiment, the X-shim, Y-shim, and Z-shim coils may be Golay type coils. In another embodiment, these coils may be distributed coils. In an embodiment, the active resistive shim coil assembly 208 may further include a zero-order shim coil. It is to be appreciated that the choice and arrangement of the active shim coils in the active resistive shim coil assembly 208 may vary, depending on the expected inhomogeneity in the magnetic fields in the imaging volume and the degrees of freedom that are desired.

In an embodiment, the active shim coil assembly 208 may include X-type, Y-type, and Z-type active shim coils and not include a second order or higher order shim coil. By providing currents to these X-type, Y-type, and Z-type active shim coils through a plurality of power channels, the harmonies of Z0, Z2, XZ, YZ, XY, and X2-Y2 shim coils, as well as higher order shims, can be generated.

Figure 3B:
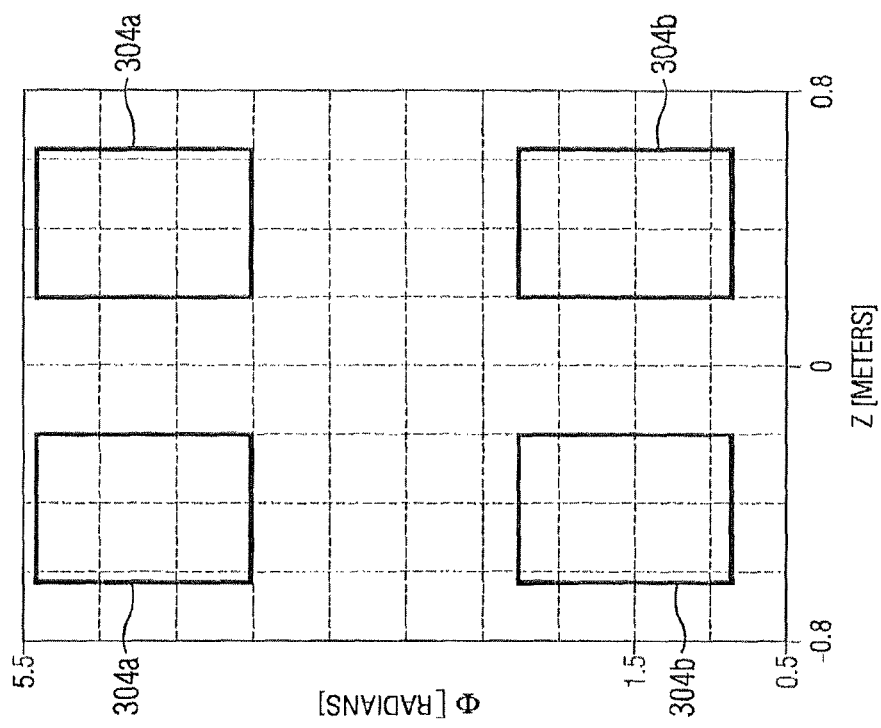
FIGS. 3A-C show exemplary current patterns of some embodiments of the X-shim, Y-shim, and Z-shim coils of the present disclosure.
Figure 3A:
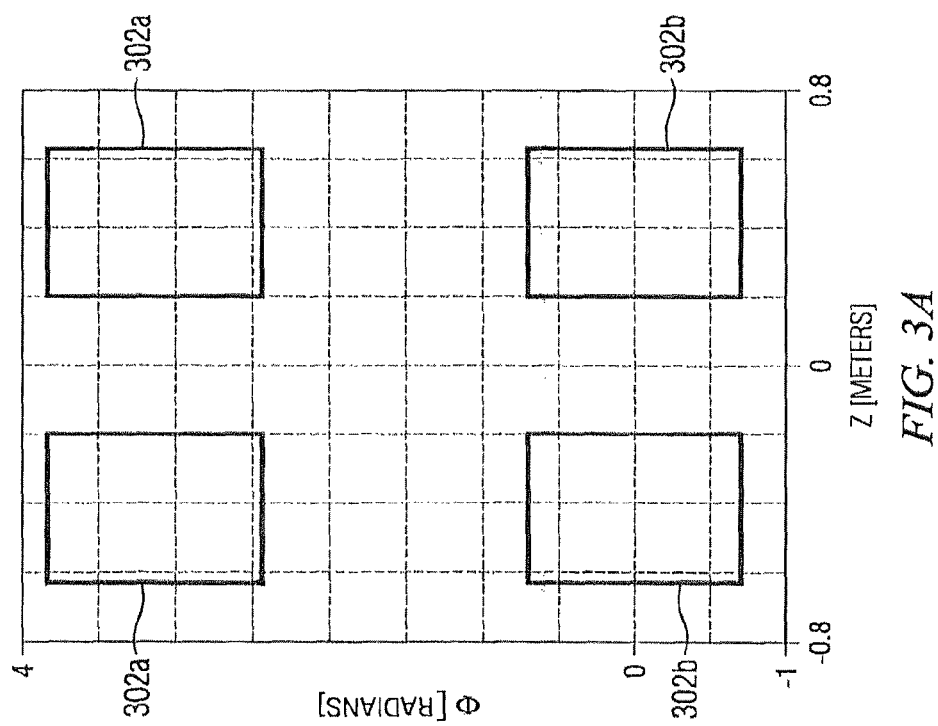
Figure 3C:
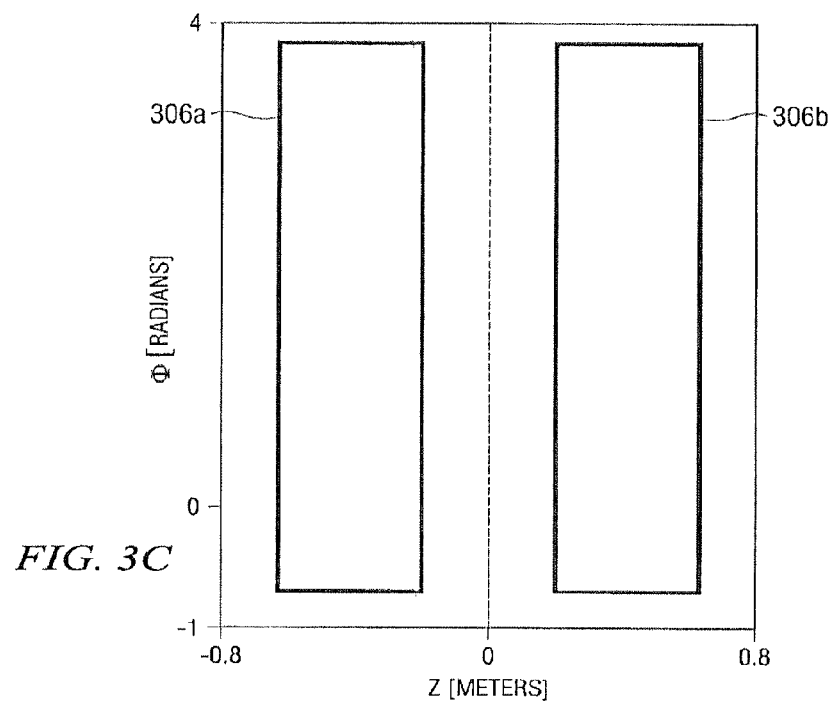
Figure 4:
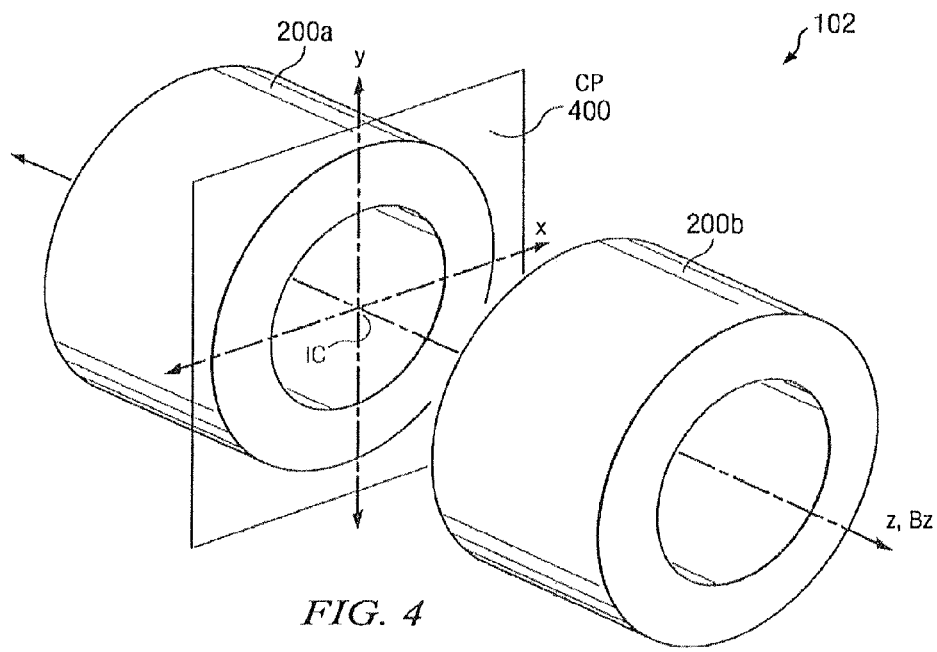
FIG. 4 shows a perspective view of a simplified diagram for the embodiment of the system shown in FIG. 1.

Active resistive shim coils suitable to be included in the active resistive shim coil assembly 208 may include a variety of current patterns and number of connections to different power channels that allow for various degrees of freedoms. Referring to FIG. 3A, in an exemplary embodiment, the current pattern of an X-shim coil may be configured to include at least four quadrants. In an embodiment, the X-shim coil may include first and second pairs of quadrants 302a and 302b disposed symmetrically about a central plane 400 illustrated FIG. 4. FIG. 4 is a simplified schematic of the MRI system 100, and as illustrated, a central plane 400 normal to the longitudinal axis 206 may be defined by an X-axis and a Y-axis. In a horizontal open MRI system, the central plane 400 is centered within the gap 102 between the magnets 200. Turning to FIG. 3B, in an embodiment, a Y-shim coil may also include at least four quadrants, with first and second pairs of quadrants 304a and 304b being disposed symmetrically about the central plane 400 as shown in FIG. 4. The current pattern of the Z-shim type coil may include at least two halves 306a, 306b disposed symmetrically about the central plane 400 as shown in FIG. 3C. The radial order of X-shim, Y-shim, and Z-shim coils may be determined by the fact that the X dimension is typically larger than the Y dimension and Z-shim coils are more efficient than X and Y coils.

Figure 5D:
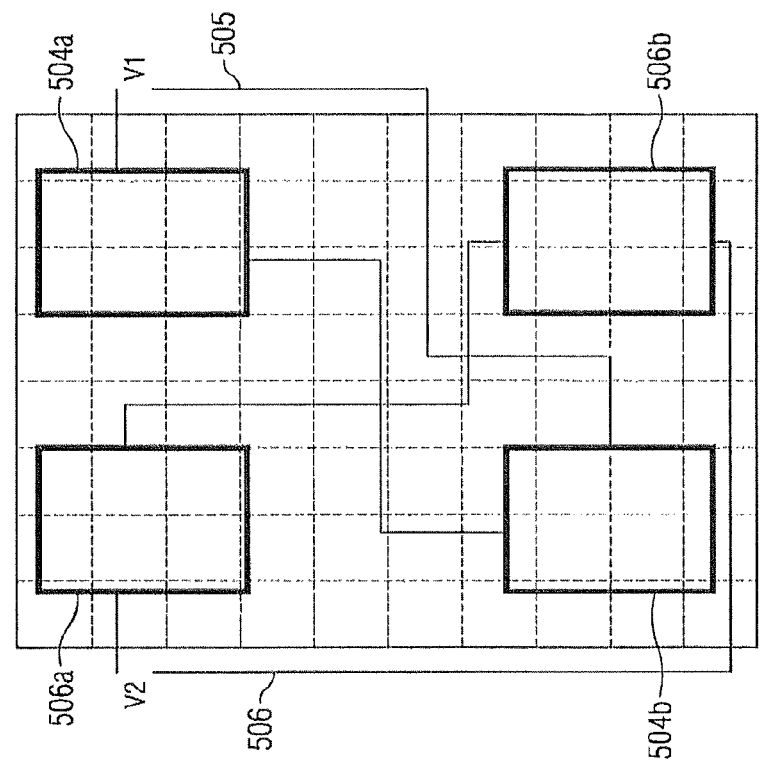
FIG. 5D shows a fourth power connection scheme for a plurality of quadrants of the X-shim or Y-shim coils.
Figure 5C:
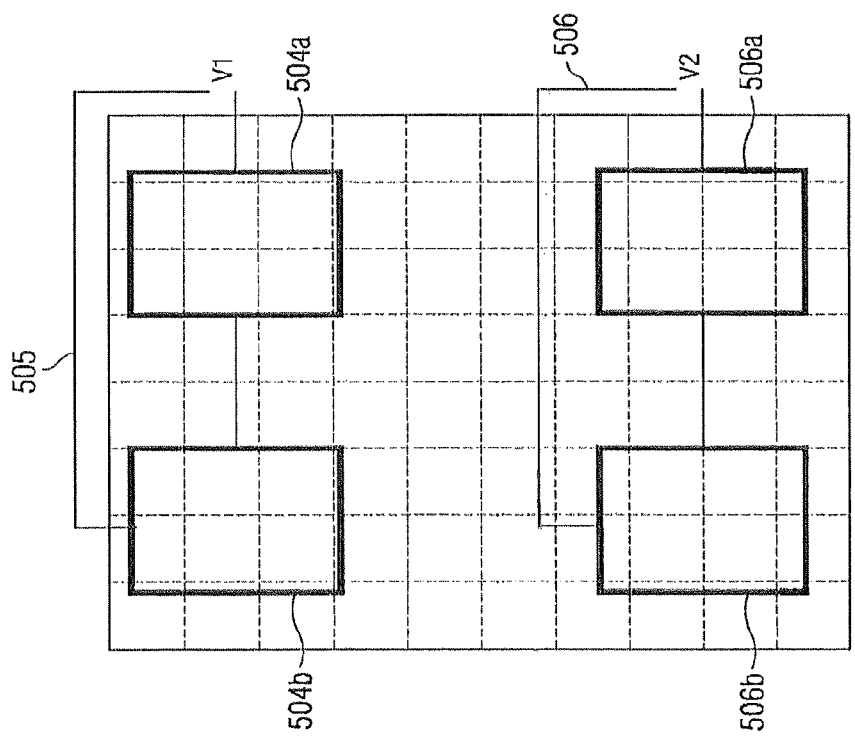
FIG. 5C shows a third power connection scheme for a plurality of quadrants of the X-shim or Y-shim coils.

In an exemplary embodiment, to allow for greater degrees of freedom in shimming out various field in-homogeneity in the imaging volume, the active X-shim, active Y-shim, and active Z-shim coils may each include a plurality of quadrants operable to be energized by currents from separate power channels. For example, two halves of the Z-shim coil may be operable to be energized by currents from two respective power channels, allowing for two degrees of freedom. There are a number of ways for connecting the quadrants of the active X-shim coil and active Y-shim type coil, resulting in different degrees of freedom. In the exemplary embodiment illustrated by FIG. 5A, each quadrant 502 of the X-shim and Y-shim coils may be connected to a separate power channel 503, resulting in four degrees of freedom for each of the X- and Y-shim coils. In the embodiment illustrated in FIG. 5B, the first and second quadrants 504a, 504b of the X-shim coil are connected in series to a first power channel 505 and third and fourth quadrants 506a, 506b of the X-shim coil are connected in series to a second power channel 506. The Y-shim coil may be similarly configured to include first and second quadrants 504a, 504b connected in series to a first power channel 505 and third and fourth quadrants 506a, 506b connected in series to a second power channel 506. Other exemplary schemes for connecting the first and second quadrants 504a, 504b in series and the third and fourth quadrants 506a, 506b in series are shown in FIGS. 5C-5D. In addition to the exemplary power channel arrangements shown in FIGS. 5A-5D, other arrangements may also be used, including various connections that allow for one power channel to provide currents to three or four of the quadrants of the X-shim or Y-shim coils.

The above discussed configurations of the X-shim, Y-shim, and Z-shim coils allow for various degrees of freedom. In an exemplary embodiment, the two halves of the active Z-shim coil are operable to be energized by currents from two respective power channels and the four quadrants of each of the X-shim and Y-shim coils are operable to be energized by currents from four respective power channels, and there are 10 degrees of freedom for active shimming. In another exemplary embodiment, the shim coils may be configured as follows: 1) two quadrants of the Z-shim coil are operable to be energized by currents from two respective power channels; 2) first and second quadrants of the Y-shim coil are connected in series and operable to be energized by currents from two respective power channels and third and fourth quadrants of the Y-shim coil are connected in series and operable to be energized by currents from two respective power channels; and 3) first and second quadrants of the X-shim coil are connected in series and operable to be energized by currents from four respective power channels and third and fourth quadrants of the X-shim coil are connected in series and operable to be energized by currents from two respective power channels. Such a configuration allows for six degrees of freedom for active shimming.

In another exemplary embodiment, an MRI system may include an active shim coil assembly 208 having second order or higher order resistive shim coils. An exemplary active shim coil assembly 208 may include Z2, ZX, ZY, XZ, and X2-Y2 shim coils. The ZX and ZY resistive shim coils may be disposed symmetrically about central plane 400. The ZX resistive shim coil may include two halves separated by 180 degrees in the azimuthal direction, and the ZY resistive shim coil may also include two halves rotated from the ZX shim coil by 90 degrees. The XY resistive shim coil may include 8 quadrants: two sets of four quadrants positioned symmetrically about the central plane 400 and separated by 90 degrees in the azimuthal direction. The X2-Y2 resistive shim coil may also include two sets of four quadrants positioned symmetrically about the central plane 400 and rotated from the YZ shim coil by 90 degrees.

Similar to the shim coils of the exemplary open MRI system discussed above, the Z2, ZX, ZY, XZ, and X2-Y2 shim coils of an MRI system may each include various combinations of quadrants and/or halves operable to be energized by currents from separate power channels. The halves of ZX and ZY shim coils may each be energized by currents from separate power channels and allow for two degrees of freedom for each shim coil. The quadrants of the XY and X2-Y2 shim coils may each be energized by currents from separate power channels and allow for eight degrees of freedom for each shim coil. As such, an active shim coil assembly comprising Z2, ZX, ZY, XZ, and X2-Y2 shim coils may have more degrees of freedom than an active shim coil assembly comprising only X-shim, Y-shim, and Z-shim coils. Additionally, the power channels of the Z2, ZX, ZY, XZ, and X2-Y2 shim coils may be combined to allow for various degrees of freedom ranging from at least 4 to 20 degrees of freedom.

In an MRI system, each quadrant of the X-shim coil and Y-shim coil, and each half of the Z-shim coil may produce various spherical harmonics in the imaging volume. Listed in Table 1 below is an example of the spherical harmonics that a quadrant of the Y-shim coil may produce within 45 cm DSV:

TABLE 1

Sensitivity of first quadrant of the Y-shim coil within 45 cm DSV (for Bo = 0.345T)

| Zonal | | Tesseral | | | |
|---|---|---|---|---|---|
| n | Cn (ppm/A) | n | m | Cnm (ppm/A) | Snm (ppm/A) |
| 1 | 13.0477868 | 1 | 1 | −0.0000069 | −23.8726702 |
| 2 | −4.4638038 | 2 | 1 | 0.0000114 | −8.7860516 |
| 3 | −6.9826154 | 2 | 2 | −2.8149244 | −0.0000003 |
| 4 | −2.2513510 | 3 | 1 | −0.0000158 | −0.3793798 |
| 5 | 0.7169872 | 3 | 2 | −0.9071030 | 0.0000004 |
| 6 | 0.8262018 | 3 | 3 | 0.0000000 | 0.1495946 |
| 7 | 0.1611504 | 4 | 1 | 0.0000201 | 1.2030205 |
| 8 | −0.1400087 | 4 | 2 | −0.1069263 | −0.0000005 |
| 9 | −0.0920674 | 4 | 3 | 0.0000000 | 0.0440727 |
| 10 | −0.0165923 | 4 | 4 | 0.0028112 | 0.0000000 |
| 11 | 0.0156868 | 5 | 1 | −0.0000243 | 0.5182383 |
| 0 | 25.6068816 | 5 | 2 | 0.0518468 | 0.0000006 |
| | | 5 | 3 | 0.0000000 | 0.0064316 |
| | | 5 | 4 | 0.0007785 | 0.0000000 |
| | | 5 | 5 | 0.0000000 | 0.0001169 |

The sensitivities of the Y_2, Y_3, and Y_4 quadrants of the Y-shim coil could be found from symmetry arguments with respect to the Y_1 quadrant of the active Y-shim. In turn, the sensitivities of X_1, X_2, X_3, and X_4 quadrants of the X-shim coil could be found from symmetry with respect to the Y_1, Y_2, Y_3, and Y_4 quadrants of the Y-shim coil.

A linear combination of the sensitivities of the Y-shim coils could be formed $$SY\_shim = \sigma_1 SY\_1 + \sigma_2 SY\_2 + \sigma_3 SY\_4 \tag{1}$$

In Equation (1) SY_I (1≤I≤4) are the sensitivity of the Y_1 quadrant and $\sigma_i$ are the weighting factor. If all $\sigma_i$ are equal then the Y-shim behaves as Y-gradient. If, for example, $\sigma_1 = \sigma_3 = 1$, $\sigma_2 = \sigma_4 = -1$ then the Y-shim behaves as a conventional YZ-shim. If, for example, $\sigma_1 = \sigma_2 = 1$, $\sigma_3 = \sigma_4 = -1$ then the Y-shim behaves as combination of conventional Z2-shim with XY-shim coils. If for example $\sigma_1=\sigma_4=1$, $\sigma_3=\sigma_2=-1$ then the Y-shim behaves mostly as a conventional Z-gradient.

Listed in Table 2 below is an example of the spherical harmonics that a Z_1 half of the Z-shim coil may produce within 45 µm DSV:

TABLE 2

Axial harmonics of the Shim Z_1 over 45 cm DSV (for Bo = 0.345T)

| n | Cn (ppm/A) |
| --- | --- |
| 1 | 19.107958070 |
| 2 | −0.182409322 |
| 3 | −3.883364862 |
| 4 | −0.659129337 |
| 5 | 0.815717783 |
| 6 | 0.297190574 |
| 7 | −0.178368437 |
| 8 | −0.140483754 |
| 9 | 0.012351049 |
| 10 | 0.023010875 |
| 11 | −0.000943040 |
| 0 | 33.063044273 |

The sensitivity of the Z_2 half of the Z-shim coil could be found from symmetry arguments with respect to the Z_1 half of the Z-shim coil. Equation (2) below is an expression of the Z-component of the magnetic field in terms of spherical harmonic coefficients:

$$B_z(r, \vartheta, \varphi) = \sum_{n=1} C_n \left(\frac{r}{R_0}\right)^n P_n(\cos\vartheta) + \sum_{n=1} \left(\frac{r}{R}\right)^n \sum_{m=1}^n (C_{n,m}\cos(m\varphi) + S_{n,m}\sin(m, \varphi))P_n^m(\cos\vartheta) \quad (2)$$

In equation (2), $B_Z(r, \theta, \phi)$ is the Z-component of the magnetic field, r, θ, φ are the spherical coordinates of the observation point, $P_n^m(\cos \theta)$ are the Legendre polynomials, $C_n$ are the Zonal spherical harmonics coefficients, and $C_{n,m}$, $S_{n,m}$ are the Tesseral spherical harmonics coefficients.

In operation, one may use the separate power supplies to apply the currents to the shim coils to minimize the field in-homogeneity. This could be done by minimizing the following functional:

$$W = \frac{1}{2}\sum_{i=1}^{N}\left(\delta B_i - \sum_{n=1}^{N_D} I_n B_{i,n}\right)^2 + \frac{\lambda}{2}\sum_{n=1}^{N_D} I_n^2 \quad (3)$$

In equation (3), the notations have the following definitions:
N is the number of measurement points using the field camera.
$N_D$ is the number of base shim coils.
$\delta B_i$ is the variation of the measured field values of the magnetic field relative to the central field value $B_0$.
$B_{i,n}$ are the values of the magnetic field generated by a base shim coil (indexed by letter n), driven with a unit current, over the set of measurement points. These values represent the sensitivities of the base shim coils.
$I_n$ are the unknown currents that should be applied to the base shim coils.
λ is a regularization factor to minimize the values of the shim currents to be applied.

Variation of the functional W with respect to the unknown currents $I_n$ determines the solution.

Figure 6:
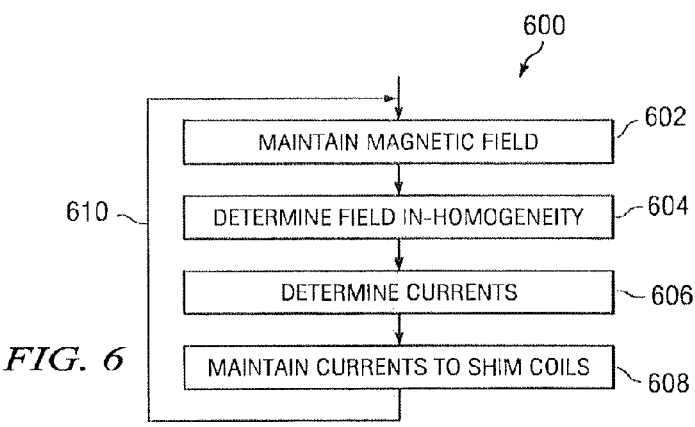
FIG. 6 is a schematic flow diagram illustrating a method for shimming field in-homogeneity in a MRI system in accordance with the present disclosure.

FIG. 6 is a flow chart showing an exemplary process suitable for shimming the MRI devices of the present disclosure. It is to be appreciated that while the actions illustrated in the flow chart may each be performed in the order illustrated, they may be performed out of the order illustrated unless otherwise specified. Various objects in or near the MRI systems of the present disclosure may introduce field-inhomogeneity in the image volume. For example, some parts sitting on gantry of an MRI device can introduce field-inhomogeneity. A robotic device used during imaging is an example of a possible source of field-inhomogeneity. The illustrated exemplary method 600 in FIG. 6 may be suitable for shimming out field in-homogeneity in a magnetic resonance imaging (MRI) system comprising a magnet, a gradient coil, and an active resistive shim coil assembly disposed outside of the magnet and proximate to the gradient coil. The MRI system may be any embodiment of the MRI system disclosed herein, and the active resistive shim coil assembly of the MRI system may include shim coils operable to be energized by currents provided through a plurality of power channels.

Action 602 of the exemplary method 600 includes operating the MRI system to maintain a magnetic field. Action 604 of the exemplary method 600 includes determining the field in-homogeneity in an imaging volume of the MRI system. Based on the field-homogeneity, actions 606 and 608 of the method 600 may include determining currents to be provided to the shim coils of the active resistive shim coil assembly and applying the currents to the shim coils, respectively. The currents are determined such that the shim coils energized by the currents are operable to shim out at least some of the field in-homogeneity. Action 610 may include repeating maintaining the magnetic field in action 602 and determining the field inhomogeneity in action 604 to determine whether the currents provided to the shim coils allow a desired level of field in-homogeneity. If additional shimming is desired, determining currents and applying the currents to the shim coils actions in actions 606 and 608, respectively, may be repeated to adjust the currents provided to the shim coils, and actions 602 and 604 may be repeated once more to determine the resultant field in-homogeneity. After iterations of the actions 602, 604, 606, and 608, the shim coils may be energized by currents that are tuned to shim out most of the field in-homogeneity. Residual in-homogeneity may be shimmed out with adjustment of passive shims.

It is to be appreciated that the method 600 may be an iterative method that would be burdensome and difficult to perform if the shim coils are disposed inside the magnet. In such a case, the connections to superconductive shims would have to be performed with every iteration. However, since the active resistive shim coil assembly is disposed outside of the magnet, the method 600 may be performed while the magnet of the MRI system remains closed. This advantage not only allows for easy adjustment of the currents for energizing the shim coils but also may synergistically allow for real-time adjustments of currents to the shim coils during imaging as the source of the field in-homogeneity moves in real-time. Such real-time adjustments would allow for significantly improved imaging quality and accuracy.

Maintaining the magnetic field in action 602 and determining the field in-homogeneity in action 604 may be accomplished in a variety of ways known in the art. In an embodiment, maintaining the magnetic field in action 602 may include maintaining the magnetic field with an object disposed in the imaging volume. The object may have a density profile and a reference magnetic field response that may have been predetermined. In such an embodiment, determining field in-homogeneity in action 604 may include measuring the magnetic field in the imaging volume and comparing the measured magnetic field with the reference magnetic field predetermined for the object. In an exemplary embodiment, a processor may receive the magnetic field measurements and use software to compare the measured magnetic field with the reference magnetic field to identify field in-homogeneity.

In an embodiment, determining field in-homogeneity in action 604 may include measuring a magnetic field over a surface and mathematically determining the magnetic field in the imaging volume based on the measured magnetic field over the surface. For example, a "magnetic camera" may be removably disposed in the MRI system. The magnetic camera may include sensors to measure the magnetic field over surface of the magnetic camera. Data collected from the sensors of the magnetic camera may be used to mathematically determine the magnetic field in the imaging volume. In an embodiment, a processor may receive data from the magnetic camera and use software to determine the magnetic field in the imaging volume based on the magnetic field over the surface of the magnetic camera.

In view of the principles discussed in the present disclosure, exemplary embodiments of the systems and methods for shimming out various field in-homogeneity are provided below.

Example 1

Figure 7:
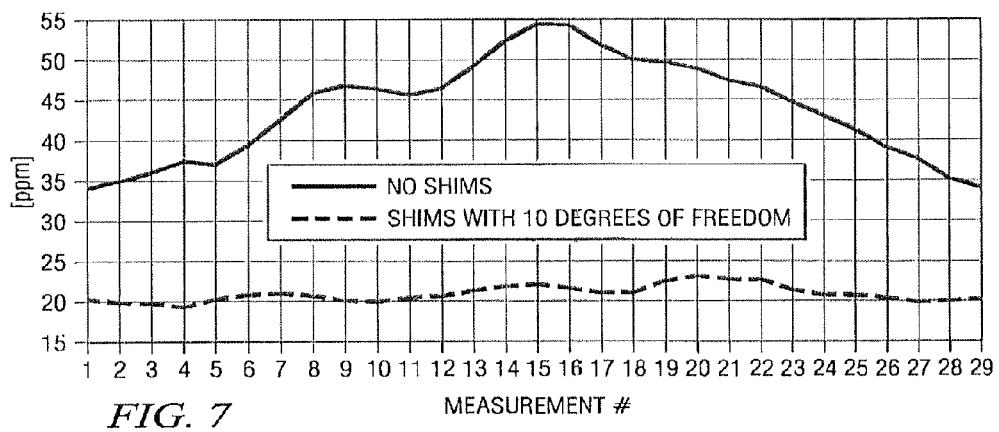
FIG. 7 shows a comparison of Peak-to-Peak in-homogeneity versus the gantry position in a first exemplary embodiment before and after active shimming using 10 degrees of freedom active shim coils.

Shimming-Out First Gantry-Induced Inhomogeneity in an embodiment, there may be 18 "links" on the gantry in a MRI system of the present disclosure. These "links" support and guide the gantry during rotation. The "links" may be manufactured from ferromagnetic material. Measurements were performed to measure how the field in-homogeneity in the imaging volume changes as the gantry rotates. A field camera (24 planes, 24 angles with 45 cm DSV, for example) was used to acquire field maps for 29 rotational gantry positions spanning 360°. The results are shown in FIG. 7 as a solid line. This figure shows that peak-to-peak measured in-homogeneity varies by 20.5 ppm during gantry rotation with an average value is 43.95 ppm.

The shimming procedure discussed above with respect to equation (3) was applied to the data acquired during these measurements using shim coils having 10 degrees of freedom. The result is shown in FIG. 7. The variation of the e simulated data in FIG. 7 is equal to 3.92 ppm with an average of 20.90 ppm. As an example, Table 3 lists the required currents for the measurements #15 and #16 where in-homogeneity was ~55 ppm.

TABLE 3

Currents for the measurements #15 and #16 where in-homogeneity was ~55 ppm (for Bo = 0.345T). 10 Degrees of Freedom

|  | Measurement | |
| --- | --- | --- |
|  | #15 | #16 |
| P-P before correction | 54.63 ppm | 54.38 ppm |
| P-P after correction | 22.01 ppm | 21.57 ppm |

TABLE 3-continued

Currents for the measurements #15 and #16 where in-homogeneity was ~55 ppm (for Bo = 0.345T). 10 Degrees of Freedom

|  | Measurement | |
| --- | --- | --- |
|  | #15 | #16 |
| Quadrants | Current to the Quadrants [A] | |
| X_1 | −0.01815 | −0.00482 |
| X_2 | −0.41991 | −0.41099 |
| X_3 | 0.141102 | 0.158243 |
| X_4 | −0.24548 | −0.22761 |
| Y_1 | −0.22888 | −0.24142 |
| Y_2 | −0.13985 | −0.14338 |
| Y_3 | −0.07196 | −0.08459 |
| Y_4 | −0.02005 | −0.03311 |
| Z_1 | 0.201617 | 0.203529 |
| Z_2 | −0.18638 | −0.1863 |

Figure 8:
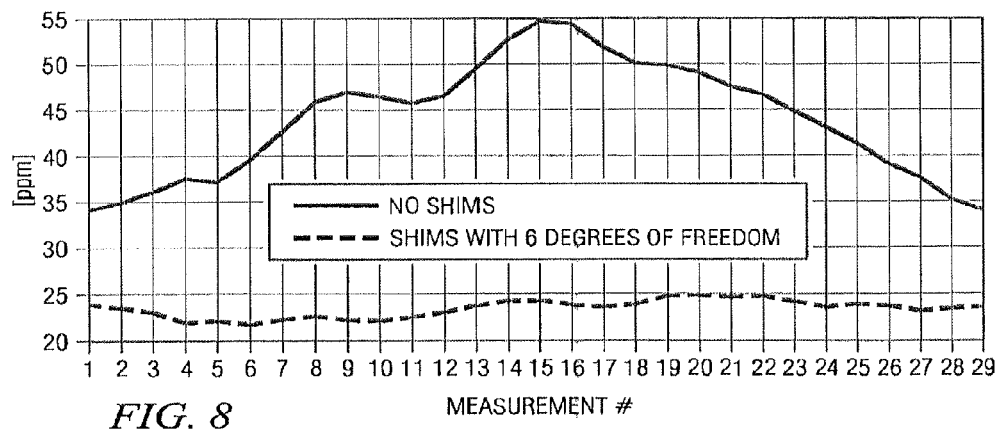
FIG. 8 shows a comparison of Peak-to-Peak in-homogeneity versus the gantry position in the first exemplary embodiment before and after active shimming using six degrees of freedom active shim coils.

Furthermore, the shimming procedure discussed above with respect to equation (3) was applied to the data acquired during these measurements using shim coils having six degrees of freedom. The six degrees of freedom may be provided by configuring X-shim, Y-shim, and Z-shim coils in accordance with any of the embodiments shown in FIGS. 5B-5D. The result is shown in FIG. 8. The variation of the simulated data in FIG. 8 is now is equal to 3.26 ppm with average of 23.45 ppm. As an example, Table 4 lists the required currents for the measurements #15 and #16 where in-homogeneity was ~55 ppm.

TABLE 4

Currents for the measurements #15 and #16 where in-homogeneity was ~55 ppm (for Bo = 0.345T). Six Degrees of Freedom.

|  | Measurement | |
| --- | --- | --- |
|  | #15 | #16 |
| P-P before correction | 54.63 ppm | 54.38 ppm |
| P-P after correction | 24.29 ppm | 23.86 ppm |
| Quadrants | Current to the Quadrants [A] | |
| X_1 | 0.059684 | 0.074866 |
| X_2 | −0.33507 | −0.32191 |
| Y_1 | −0.15041 | −0.163 |
| Y_2 | −0.07997 | −0.08826 |
| Z_1 | 0.022211 | 0.022385 |
| Z_2 | −0.01523 | −0.015 |

Example 2

Shimming-out Second Gantry-Induced Inhomogeneity

Figure 9:
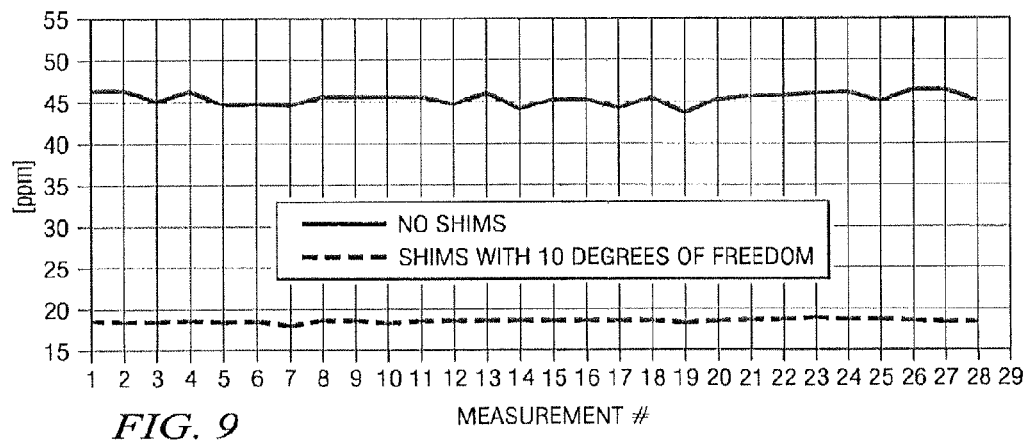
FIG. 9 shows a comparison of Peak-to-Peak in-homogeneity versus the gantry position in a second exemplary embodiment before and after active shimming using 10 degrees of freedom active shim coils.

The "links" in this example were manufactured from stainless steel, Tungsten, and Ampcoloy®. Measurements were performed to measure how the field in-homogeneity in the imaging volume changes as the gantry rotates. A field camera (24 planes, 24 angles with 45 cm DSV, for example) was used to acquire field maps for 29 rotational Gantry positions spanning 360°. The results (solid line) are shown in FIG. 9, which shows that peak-to-peak measured inhomogeneity varies by 2.67 ppm during Gantry rotation with an average value of 45.49 ppm.

The shimming procedure discussed above with respect to equation (3) was applied to the data acquired during these measurements using shim coils having 10 degrees of freedom. The result of simulated data (dashed line) is shown in FIG. 9. The variation in FIG. 9 is equal to 0.82 ppm with average of 18.50 ppm. As an example, Table 5 lists the required currents for the measurements #15 and #16 where in-homogeneity was ~45 ppm.

TABLE 5

Currents for the measurements #15 and #16 where in-homogeneity was ~45 ppm (for Bo = 0.345T). 10 Degrees of Freedom

| | Measurement | |
|---|---|---|
| | #15 | #16 |
| P-P before correction | 45.36 ppm | 45.36 ppm |
| P-P after correction | 18.53 ppm | 18.51 ppm |
| Quadrants | Current to the Quadrant [A] | |
| X_1 | 0.251106 | 0.25149 |
| X_2 | −0.14883 | −0.14978 |
| X_3 | 0.041333 | 0.040717 |
| X_4 | −0.37311 | −0.37356 |
| Y_1 | 0.041175 | 0.04138 |
| Y_2 | 0.115653 | 0.116424 |
| Y_3 | −0.2041 | −0.20237 |
| Y_4 | −0.16581 | −0.16546 |
| Z_1 | 0.175209 | 0.17454 |
| Z_2 | −0.18452 | −0.18497 |

Figure 10:
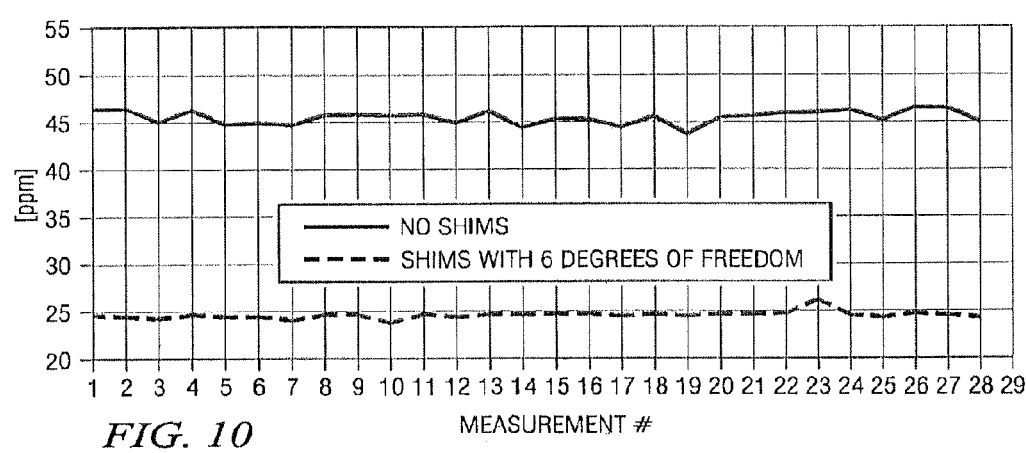
FIG. 10 shows a comparison of Peak-to-Peak in-homogeneity versus the gantry position in the second exemplary embodiment before and after active shimming with using six degrees of freedom active shim coils.

The shimming procedure discussed above with respect to equation (3) was applied to the data acquired during these measurements using shim coils having six degrees of freedom. The six degrees of freedom may be provided by configuring X-shim, Y-shim, and Z-shim coils in accordance with any of the embodiments shown in FIGS. 5B-5D. The result of simulated data (dashed line) is shown in FIG. 10. The variation of the simulated data in FIG. 10 is equal to 2.35 ppm with average of 24.50 ppm. As an example, Table 6 lists the required currents for the measurements #15 and #16 where in-homogeneity was ~45 ppm.

TABLE 6

Required currents for the measurements #15 and #16 where in-homogeneity was ~45 ppm (for Bo = 0.345T). Six Degrees of Freedom.

| | Measurement | |
|---|---|---|
| | #15 | #16 |
| P-P before correction | 45.36 ppm | 45.36 ppm |
| P-P after correction | 24.60 ppm | 24.61 ppm |
| Quadrants | Current to the Quadrants [A] | |
| X_1 | 0.148556 | 0.148475 |
| X_2 | −0.25849 | −0.25922 |
| Y_1 | −0.08148 | −0.08051 |
| Y_2 | −0.02505 | −0.02449 |
| Z_1 | 0.016816 | 0.016282 |
| Z_2 | −0.01714 | −0.01765 |

Example 3

Shimming-Out the in-Homogeneity Induced by Patient Table Motion

Figure 11:
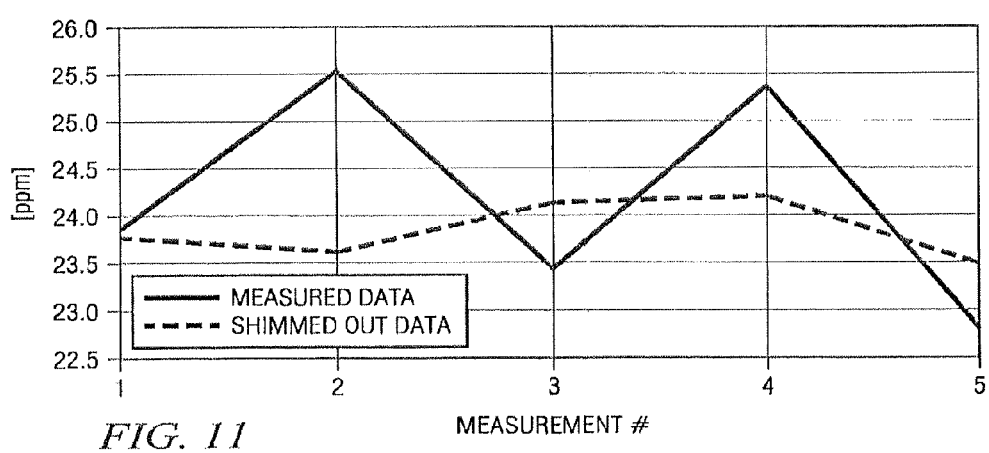
FIG. 11 shows a comparison of the field in-homogeneity in a third exemplary embodiment before and after active shimming.

The position of patient table 108 in FIG. 1 may include some magnetic materials such as motors, for example, and thus can influence the field in-homogeneity. Active shims can correct for the patient table position. The patient table in the ViewRay system contains parts that have magnetic components. This patient table is capable of moving left-right, up-down, and axially. During the axial motion the magnetic parts do not move along with the patient table. In the first two cases (left-right, up-down) the magnetic parts move along with the patient table. In these cases, the motion of the patient table will affect the field in-homogeneity. Five measurements were performed to investigate how the motion of the patient table affects the field in-homogeneity. They were:
1. Patient Table is in the default position
2. Patient Table is in the down position (100 mm below the default position)
3. Patient Table is in the up position (100 mm above the default position)
4. Patient Table is in the left position (70 mm to the left of the default position).
5. Patient Table is in the right position (70 mm to the right of the default position) FIG. 11 shows the results of the measurements (solid line).

The shimming procedure discussed above with respect to equation (3) was applied to these data using shim coils having 10 degrees of freedom. The result of the simulated data is shown in FIG. 11 as dashed line. The variation of the Peak-to-Peak measured data in-homogeneity is 2.73 ppm and the average value is 24.20 ppm. After the active shimming simulations the variation of the Peak-to-Peak in-homogeneity is 0.71 ppm and the average value is 23.80 ppm.

Example 4

Shimming-Out the in-Homogeneity of the Integrated System

A field plot of fully integrated ViewRay system was taken. The gantry includes shock-absorbers that are made from steel. The Peak-to-Peak field in-homogeneity was measured to be 98.49 ppm over 45 cm DSV. The main contribution comes from Z2-harmonics. This kind of behavior may be attributable to the symmetry of the loaded gantry. A few harmonies are listed in Table 7.

TABLE 7

45 cm DSV Spherical Harmonics of the Integrated System (for Bo = 0.345T)

| n | Cn [ppm] | n | m | Cnm [ppm] | Snm [ppm] |
|---|---|---|---|---|---|
| 1 | 1.517020968 | 1 | 1 | 1.773949069 | 4.494422298 |
| 2 | −57.832699259 | 2 | 1 | 1.732990292 | 0.423754032 |
| 3 | 0.061525062 | 2 | 2 | −0.830090121 | −0.783903003 |
| 4 | 2.955558965 | 3 | 1 | −0.664953782 | −0.750731476 |
| 5 | 0.507635837 | 3 | 2 | −0.214451419 | −0.323832839 |
| 6 | 1.301169076 | 3 | 3 | −0.040657666 | 0.083373198 |
| 7 | −1.552003664 | 4 | 1 | 0.374808298 | −0.044613125 |
| 8 | −0.410993035 | 4 | 2 | 0.157056953 | 0.142087971 |
| 9 | 1.188085325 | 4 | 3 | −0.003003806 | −0.007139001 |
| 10 | 0.379692981 | 4 | 4 | 0.001822970 | −0.002748548 |

TABLE 7-continued 45 cm DSV Spherical Harmonics of the Integrated System (for Bo = 0.345T)

| n | Cn [ppm] | n | m | Cnm [ppm] | Snm [ppm] |
|---|---|---|---|---|---|
| 11 | −0.618562815 | 5 | 1 | 0.433918168 | −0.068599015 |
| 12 | −1.453838802 | 5 | 2 | −0.000442141 | 0.004815001 |
| 13 | 0.249818389 | 5 | 3 | 0.009153570 | −0.000884706 |
| 14 | 0.568787336 | 5 | 4 | 0.000696611 | 0.000479973 |
| 15 | −0.066938561 | 5 | 5 | 0.000207692 | 0.000735643 |

The data indicates that there is a strong Z2 harmonics present, which is consistent with Table 7. The shimming procedure discussed above with respect to equation (3) was applied to these data using shim coils having 10 degrees of freedom. After shimming, the field in-homogeneity was reduced to 22.4 ppm. Table 8 and Table 9 below list the comparison of the Zonal and Tesseral harmonics, respectively, before and after active shimming. Table 8 and Table 9 indicate that the job that the active shim coils have done is nullifying the linear and quadratic harmonics almost to zero. The harmonic Z4 has changed the sign. The rest of the harmonics have not changed significantly.

TABLE 8

Comparison of Zonal harmonics Before and After Active Shimming (for Bo = 0.345T)

| n | Before Shimming Cn [ppm] | After Shimming Cn [ppm] |
|---|---|---|
| 1 | 1.5170210 | 0.0181623 |
| 2 | −57.8326993 | 0.8793326 |
| 3 | 0.0615251 | 0.0947799 |
| 4 | 2.9555590 | −2.6058195 |
| 5 | 0.5076358 | 0.5634297 |
| 6 | 1.3011691 | −0.7928871 |
| 7 | −1.5520037 | −1.5673275 |
| 8 | −0.4109930 | 0.6684033 |
| 9 | 1.1880853 | 1.1912049 |
| 10 | 0.3796930 | 0.0667499 |
| 11 | −0.6185628 | −0.6145252 |
| 12 | −1.4538388 | −1.4034106 |
| 13 | 0.2498184 | 0.25066619 |
| 14 | 0.5687873 | 0.61271414 |
| 15 | −0.0669386 | −0.0711799 |
| 16 | −0.1137788 | −0.0429214 |
| 17 | −0.0554951 | −0.0608793 |
| 18 | −0.1098128 | −0.0681778 |
| 19 | 0.1445696 | 0.14478452 |

TABLE 9

Comparison of the Tesseral Harmonics Before and After Active Shimming (for Bo = 0.345T)

| | | Before Shimming | | After Shimming | |
|---|---|---|---|---|---|
| n | m | Cnm [ppm] | Snm [ppm] | Cnm [ppm] | Snm [ppm] |
| 1 | 1 | 1.7739491 | 4.4944223 | 0.0181965 | 0.2232480 |
| 2 | 1 | 1.7329903 | 0.4237540 | 0.0854036 | −0.0142033 |
| 2 | 2 | −0.8300901 | −0.7839030 | 0.0083130 | −0.7839032 |
| 3 | 1 | −0.6649538 | −0.7507315 | −0.5782315 | −0.5397995 |
| 3 | 2 | −0.2144514 | −0.3238328 | −0.0030855 | −0.3238326 |
| 3 | 3 | −0.0406577 | 0.0833732 | −0.0541602 | 0.1162205 |
| 4 | 1 | 0.3748083 | −0.0446131 | 0.7309438 | 0.0500842 |
| 4 | 2 | 0.1570570 | 0.1420880 | 0.1488944 | 0.1420877 |
| 4 | 3 | −0.0030038 | −0.0071390 | −0.0131880 | −0.0044318 |
| 4 | 4 | 0.0018230 | −0.0027485 | −0.0171976 | −0.0027485 |
| 5 | 1 | 0.4339182 | −0.0685990 | 0.4493716 | −0.0309976 |
| 5 | 2 | −0.0004421 | 0.0048150 | −0.0239295 | 0.0048154 |

TABLE 9-continued

Comparison of the Tesseral Harmonics Before and After Active Shimming (for Bo = 0.345T)

| | | Before Shimming | | After Shimming | |
|---|---|---|---|---|---|
| n | m | Cnm [ppm] | Snm [ppm] | Cnm [ppm] | Snm [ppm] |
| 5 | 3 | 0.0091536 | −0.0008847 | 0.0091089 | −0.0007758 |
| 5 | 4 | 0.0006966 | 0.0004800 | 0.0007102 | 0.0004800 |
| 5 | 5 | 0.0002077 | 0.0007356 | 0.0002204 | 0.0007665 |

Table 10 lists the required current in the shim coils.

TABLE 10

Currents for shimming out the in-homogeneity of the integrated system (for Bo = 0.345T). 10 Degrees of Freedom were used

| P-P before correction | 98.49 ppm |
|---|---|
| P-P after correction | 22.40 ppm |
| Quadrants | Current to the Quadrants [A] |
| X_1 | −0.3568 |
| X_2 | −0.50935 |
| X_3 | 0.480535 |
| X_4 | 0.441365 |
| Y_1 | −0.47634 |
| Y_2 | −0.45163 |
| Y_3 | 0.569628 |
| Y_4 | 0.49395 |
| Z_1 | 1.400789 |
| Z_2 | −1.45652 |

Active Shimming of the LINAC-MRI System

A LINAC-MRI system is described in U.S. Patent Appl. Pub. No. 2011/0012593, which is herein incorporated by reference. Such a LINAC-MRI system may be modified to include the shim coil assemblies 208 as discussed in the present disclosure. In an exemplary LINAC-MRI system, the LINAC induced field in-homogeneity over 45 cm DSV is equal to 914.67 ppm. The spherical harmonics are mainly Z2, Z4, X, and Y as listed in Table 11.

TABLE 11

Spherical Harmonics over 45 cm DSV Before Shimming (for Bo = 0.345T)

| n | Cn [ppm] | n | m | Cnm [ppm] | Snm [ppm] |
|---|---|---|---|---|---|
| 1 | −0.0073703 | 1 | 1 | −200.4339171 | 347.2792350 |
| 2 | −126.2154185 | 2 | 1 | 0.0061610 | 0.0010506 |
| 3 | −0.0143934 | 2 | 2 | −16.5780104 | −28.6976572 |
| 4 | 10.2419211 | 3 | 1 | 10.0586748 | −17.4245919 |
| 5 | −0.0155341 | 3 | 2 | −0.0006188 | 0.0004391 |
| 6 | −0.5646889 | 3 | 3 | 1.5445963 | −0.0004269 |
| 7 | −0.0203373 | 4 | 1 | −0.0006777 | −0.0026722 |
| 8 | 0.4008913 | 4 | 2 | 0.4713509 | 0.8165001 |
| 9 | −0.0311033 | 4 | 3 | −0.0000014 | −0.0000411 |
| 10 | 2.2975828 | 4 | 4 | −0.0249194 | 0.0432091 |
| 11 | −0.0390253 | 5 | 1 | −0.4793326 | 0.8338403 |
| 12 | −1.6230811 | 5 | 2 | 0.0000415 | 0.0000339 |
| 13 | −0.0352530 | 5 | 3 | −0.0305149 | 0.0000191 |
| 14 | 0.2888609 | 5 | 4 | 0.0000013 | 0.0000008 |
| 15 | −0.0238106 | 5 | 5 | −0.0006154 | −0.0010665 |

After the active shims were applied with the shim coil assemblies of the present disclosure, the field in-homogeneity was reduced to 29.88 ppm over 45 cm DSV, and the corresponding spherical harmonics are listed in Table 12.

TABLE 12

Spherical Harmonics over 45 cm DSV
After Active Shimming (for Bo = 0.345T)

| n | Cn [ppm] | n | m | Cnm [ppm] | Snm [ppm] |
|---|---|---|---|---|---|
| 1 | 0.0001023 | 1 | 1 | −0.5868441 | 0.2740091 |
| 2 | −0.0422085 | 2 | 1 | 0.0000569 | −0.0000012 |
| 3 | 0.0002382 | 2 | 2 | 0.0855392 | −2.8697675 |
| 4 | −0.1723021 | 3 | 1 | 0.0448732 | −0.0409589 |
| 5 | −0.0003141 | 3 | 2 | 0.0000012 | 0.0000464 |
| 6 | −0.5061831 | 3 | 3 | 0.3040916 | 0.2649268 |
| 7 | −0.0002228 | 4 | 1 | 0.0000633 | 0.0000750 |
| 8 | 0.2687102 | 4 | 2 | 0.0301628 | 0.0816468 |
| 9 | −0.0003557 | 4 | 3 | −0.0000035 | −0.0000022 |
| 10 | 0.1600720 | 4 | 4 | −0.0065633 | 0.0043209 |
| 11 | −0.0004383 | 5 | 1 | −0.2193784 | 0.3866175 |
| 12 | −0.15426654 | 5 | 2 | −0.0000072 | 0.0000072 |
| 13 | −0.000405966 | 5 | 3 | −0.0025555 | 0.0008802 |
| 14 | 0.035666269 | 5 | 4 | 0.0000001 | 0.0000001 |
| 15 | −0.00028356 | 5 | 5 | −0.0002020 | 0.0001421 |

The corresponding shim currents are listed in Table 13.

TABLE 13

Currents for shimming out the in-homogeneity of the integrated system (for Bo = 0.345T). 10 Degrees of Freedom were used

| P-P before correction | 914.67 ppm |
|---|---|
| P-P after correction | 29.88 ppm |

| Quadrants | Current to the Quadrants [A] |
|---|---|
| X_1 | −2.0541 |
| X_2 | −2.0544 |
| X_3 | −1.0763 |
| X_4 | −1.0766 |
| Y_1 | 1.2109 |
| Y_2 | 1.2110 |
| Y_3 | 4.3333 |
| Y_4 | 4.3327 |
| Z_1 | 3.1087 |
| Z_2 | 3.1085 |

In this example, the in-homogeneity was shimmed out using the active shim coils. Another approach is to apply gradient offsets to nullify the linear terms X and Y. Application of the gradient offsets also introduces the higher order impurities that are the internal properties of the gradient coils. In this case, the field in-homogeneity is equal to 366.50 ppm over 45 cm DSV. After the active shimming, the field in-homogeneity is reduced to 24.9 ppm.

The corresponding shim currents are listed in Table 14. In this case, the currents in the Z-shims remain about the same as in Table 13 and the currents for X- and Y-shims are reduced about three times compared to those in Table 13.

TABLE 14

Currents for shimming out the in-homogeneity of the integrated system (for Bo = 0.345T). 10 Degrees of Freedom and Gradient offsets were used

| P-P before correction | 366.50 ppm |
|---|---|
| P-P after correction | 24.90 ppm |

| Quadrants | Current to the Quadrants [A] |
|---|---|
| X_1 | −0.4818 |
| X_2 | −0.4792 |
| X_3 | 0.5204 |
| X_4 | 0.5177 |
| Y_1 | −1.5417 |
| Y_2 | −1.5386 |
| Y_3 | 1.5636 |
| Y_4 | 1.5606 |
| Z_1 | 3.1074 |
| Z_2 | 3.1025 |

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above described advantages are not intended to limit the application of any issued claims to processes and structures accomplishing any or all of the advantages.

Additionally, section headings shall not limit or characterize the invention(s) set out in any claims that may issue from this disclosure. Specifically, and by way of example, although the headings refer to a "Technical Field," such claims should not be limited by the language chosen under this heading to describe the so-called technical field. Further, the description of a technology in the "Background" is not to be construed as an admission that technology is prior art to any invention(s) in this disclosure. Neither is the "Summary" to be considered as a characterization of the invention (s) set forth in issued claims. Furthermore, any reference to this disclosure in general or use of the word "invention" in the singular is not intended to imply any limitation on the scope of the claims set forth below. Multiple inventions may be set forth according to the limitations of the multiple claims issuing from this disclosure, and such claims accordingly define the invention(s), and their equivalents, that are protected thereby.

What is claimed is:

1. A system comprising:
    an active resistive shim coil assembly configured to be disposed outside of a first magnet of a magnetic resonance imaging system and proximate to a first gradient coil of the magnetic resonance imaging system, the first gradient coil being disposed between the first magnet and a longitudinal axis extending through a bore of the first magnet, the longitudinal axis parallel to a main magnetic field generated by the first magnet of the magnetic resonance imaging system, the active resistive shim coil assembly comprising:
        a plurality of shim coils; and
        a plurality of connections configured to connect each of the plurality of shim coils to a plurality of power channels, the plurality of shim coils being operable to be energized by separate currents through the plurality of power channels.

2. The system of claim 1, wherein the magnetic resonance imaging system further comprises a second magnet spaced apart from the first magnet by a gap configured to receive an instrument, wherein the first gradient coil is a split gradient coil and the plurality of shim coils are split shim coils.

3. The system of claim 1, wherein at least one of the plurality of shim coils comprises a split resistive shim coil comprising four quadrants, wherein a first pair of the four quadrants of the split resistive shim coil are disposed symmetrically about a central plane and a second pair of the four quadrants of the split resistive shim coil are disposed symmetrically about the central plane.

4. The system of claim 1, wherein at least one of the plurality of shim coils comprises a split resistive shim coil comprising a pair of halves disposed symmetrically about a central plane.

5. The MRI system of claim 1, wherein the plurality of shim coils comprises an X-shim coil, a Y-shim coil, and a Z-shim coil.

6. The system of claim 5, wherein the plurality of shim coils further comprise a zero-order shim coil.

7. The system of claim 5, wherein the X-shim coil comprises four quadrants operable to be energized by currents from four respective power channels, the Y-shim coil comprises four quadrants operable to be energized by currents from four respective power channels, and the Z-shim coil comprises two halves operable to be energized by currents from two respective power channels.

8. The system of claim 5, wherein the active X-shim coil comprises four quadrants, the active Y-shim coil comprises four quadrants, and the Z-shim coil comprises two halves, and wherein two pairs of the quadrants of the active X-shim coil are operable to be energized by currents from two respective power channels of the plurality of power channels, two pairs of the quadrants of the active Y-shim coil are operable to be energized by currents from two respective power channels of the plurality of power channels, and the two halves of the active Z-shim coil are operable to be energized by currents from two respective power channels of the plurality of power channels.

9. The system of claim 1, further comprising a passive shimming device.

10. The system of claim 1, further comprising the first gradient coil, and wherein the active resistive shim coil assembly and the first gradient coil are disposed inside a single module.

11. The system of claim 1, wherein the active resistive shim coil assembly is configured to be disposed between the first magnet and the first gradient coil.

12. The system of claim 1, wherein the active resistive shim coil assembly is configured to be disposed between the first gradient coil and the longitudinal axis.

13. An active resistive shim coil assembly comprising:
a resistive Z2-shim coil;
a resistive ZX shim coil comprising two halves separated by 180 degrees in an azimuthal direction;
a resistive ZY shim coil comprising another two halves rotated from the resistive ZX shim coil by 90 degrees, wherein the ZX and ZY resistive shim coils are disposed symmetrically about a central plane;
a resistive XZ shim coil comprising two sets of four quadrants positioned symmetrically about the central plane and separated by 90 degrees in the azimuthal direction;
a resistive X2-Y2 shim coil comprising another two sets of four quadrants positioned symmetrically about the central plane and rotated from the YZ resistive shim coil by 90 degrees;

resistive Z2-shim, ZX-shim, ZY-shim, XZ-shim, and X2-Y2 shim coils are each operable to be energized by separate currents through a plurality of power channels.

14. The active resistive shim coil assembly of claim 13, wherein the two halves of the ZX-shim coil and the other two halves of the ZY-shim coil are operable to be energized by currents from separate power channels to allow for two degrees of freedom for each of the ZX-shim coil and the ZY-shim coil.

15. The active resistive shim coil assembly of claim 13, wherein first and second quadrants of the X-shim coil are connected in series and operable to be energized by a current from a first power channel and third and fourth quadrants of the X-shim coil are connected in series and operable to be energized by a current from a second power channel.

16. The active resistive shim coil assembly of claim 13, wherein the two sets of four quadrants of the XY-shim coil and the other two sets of four quadrants of the X2-Y2-shim coil are operable to be energized by currents from separate power channels to allow for eight degrees of freedom for each of the XY-shim coil and the X2-Y2-shim coil.

17. The system of claim 1, wherein the plurality of shim coils are each configured to be energized by independent currents through the plurality of power channels.

18. A method comprising:
determining currents to be provided to shim coils of an active resistive shim coil assembly disposed outside of a magnet of a magnetic resonance imaging system and proximate to a gradient coil of the magnetic resonance imaging system, the currents comprising first currents being operable to shim out at least some field inhomogeneity of the magnetic resonance imaging system, each of the shim coils comprising a plurality of coils;
applying the first currents to the shim coils of the active resistive shim coil assembly to shim out the at least some field inhomogeneity;
determining that the first currents do not allow a desired level of field homogeneity of the magnetic resonance imaging system;
applying additional currents to the to the shim coils of the active resistive shim coil assembly to further improve the field homogeneity of the magnetic resonance imaging system; and
wherein the first currents and the additional currents comprise a plurality of independent currents for each of the plurality of coils.

19. The method of claim 18, wherein the determining of the currents to be provided to the shim coils of the active resistive shim coil assembly comprises mathematically determining a magnetic field in an imaging volume of the magnetic resonance imaging system.

20. The method of claim 19, wherein the mathematically determining comprises receiving data from one or more sensors of a magnetic camera and quantifying the magnetic field over a surface of the magnetic camera using one or more processors.

21. The method of claim 18, further comprising shimming out residual in-homogeneity by adjusting one or more passive shims.

\* \* \* \* \*